United States Patent [19]
Sato et al.

[11] Patent Number: 5,488,255
[45] Date of Patent: Jan. 30, 1996

[54] COOLING DEVICE FOR SEMICONDUCTOR PACKAGES, HAVING FLEXIBLE FILM HEAT EXPULSION MEANS

[75] Inventors: Kazuo Sato, Tokyo; Mitsuhiro Shikida, Tsuchiura; Shigeo Ohashi, Tsuchiura; Toshio Hatada, Tsuchiura; Noriyuki Ashiwake, Tsuchiura; Shinji Tanaka, Ushiku; Takeshi Harada, Abiko; Yukio Honda, Fuchu, all of Japan

[73] Assignee: Hitachi, Ltd., Tokyo, Japan

[21] Appl. No.: 162,265

[22] Filed: Dec. 7, 1993

[30] Foreign Application Priority Data

Dec. 7, 1992 [JP] Japan .................................. 4-326422
Feb. 17, 1993 [JP] Japan .................................. 5-027763

[51] Int. Cl.[6] .................................................. H01L 23/34
[52] U.S. Cl. ........................... 257/718; 257/719; 257/717
[58] Field of Search ...................................... 257/666, 712, 257/713, 717, 730, 718, 719, 796, 930, 659; 310/46, 152, 323, 328

[56] References Cited

U.S. PATENT DOCUMENTS

| 4,935,864 | 6/1990 | Schmidt et al. ........................ 257/719 |
| 5,008,582 | 4/1991 | Tanuma et al. . |
| 5,132,873 | 7/1992 | Nelson et al. ......................... 257/718 |

OTHER PUBLICATIONS

Technische Rundschau, vol. 84, No. 42, 16 Oct. 1992, Bern CH, pp. 72–73.

Primary Examiner—Sara W. Crane
Assistant Examiner—Jhihan Clark
Attorney, Agent, or Firm—Antonelli, Terry, Stout & Kraus

[57] ABSTRACT

A cooling device according to the present invention, in which a space is formed by means of flat electrodes and side plates disposed on the ends of the flat electrodes, and a flexible film fastened in that space in a shape of the letter S, is fixed to a semiconductor package so that one of the flat electrodes is fitted on the semiconductor package. The respective flat electrodes are alternately powered to move the S shaped section of the flexible film.

10 Claims, 13 Drawing Sheets

DIRECTION OF MAGNETIZATION

COOLING DEVICE FOR SEMICONDUCTOR PACKAGES, HAVING FLEXIBLE FILM HEAT EXPULSION MEANS

BACKGROUND OF THE INVENTION

1. Field of the Invention

The present invention relates to a cooling device, a semiconductor package on which the cooling device is mounted and a computer which includes this semiconductor package, and more particularly to a preferred cooling device which dissipates heat from either of the semiconductor package and a substrate on which the semiconductor package is mounted.

2. Description of the Related Art

With the recent progress of the integration of electronic circuits, in substrates including semi-conductor packages in which semiconductor chips containing electronic circuits are packaged, heat generated per unit area tends to increase. Some packaging substrates such as a printed circuit board, on which a variety of semiconductor packages and electronic parts are mounted, often include semiconductor packages which generate more heat than ordinary semiconductor packages. When these substrates are mounted on electronic devices in high concentration, in order to have the semiconductor packages work stably it is necessary to maintain the temperatures of the semiconductor package or the substrate at predetermined values and thus it is necessary to dissipate heat from the surface of the substrate or an electronic device effectively.

As a method for dissipating heat from these semiconductor packages, substrates and electronic devices including the semiconductor packages or substrates, Japanese Patent Unexamined Publication No. 2-130894, for example, has disclosed a method for blowing air to a plurality of substrates by means of a large size rotation fan which produces air flow in a computer.

Japanese Patent Unexamined Publication Nos. 2-83958 and 2-196454 have disclosed a cooling method for directly providing a circuit substrate with a miniature size rotation fan.

Moreover, Japanese Patent Unexamined Publication No. 62-149158 has disclosed a method for directly providing a circuit substrate with a reciprocating type fan employing a piezo-vibrator instead of the miniature size rotation fan.

According to the method for blowing air to a plurality of substrates by means of a large size rotation fan in the prior art described above, it is difficult to feed air uniformly to all of the substrates and if a semiconductor package having a high heat generation density is mixed into the substrate, it is difficult to cool the respective elements uniformly. A further problem is that the fan occupies a large area in the computer.

The method in which a miniature size fan or a reciprocating type fan unit employing a piezo-vibrator is directly mounted on a substrate is effective for the substrate on which the semiconductor packages having high heat generation density are mixedly mounted.

However, with the miniature size rotation fan, the efficiency of the fan tends to decrease and additionally, since space for air to be blown to the semiconductor package is needed, a wide space in a direction perpendicular to the substrate is required. With the reciprocating type fan employing the piezo-vibrator, it is necessary to locate the fan away from the surface of the substrate to blow air to the surface of the substrate. On the other hand, if the height of the fan from the substrate is reduced so that the fan edges operate as if they sweep the surface of the substrate, the fan scans only a part of the substrate surface, and thereby the cooling efficiency is not satisfactory.

SUMMARY OF THE INVENTION

An object of the present invention is to provide a cooling device having a very thin construction and a high heat radiation effect in order to provide a substrate and an electronic device on which semiconductor packages having a highly heat generation density are high concentratedly mounted.

Another object of the present invention is to provide a cooling device which is driven by a low voltage and has a thin construction in order to mount substrates at an even higher concentration.

According to the present invention, there is provided a cooling device mounted on a semiconductor package, comprising a flexible film, both ends of which are fastened and flexible film driving means for changing shape of the flexible film.

According to another aspect of the present invention, there is provided a cooling device comprising a pair of flat plates which face each other with a gap therebetween, a pair of side plates which are disposed on both ends of the plates so as to define a space with the pair of flat plates and a flexible film which is disposed in the space, both ends of the flexible film being fastened near different side plates on different flat plates so that the shape of said flexible film is changeable within said space.

According to still another aspect of the present invention, there is provided a cooling device comprising a pair of flat electrodes, the surfaces of which are insulated and are disposed opposite to each other, a pair of side plates which are disposed on both ends of the flat electrodes with a gap so as to define a space with said flat electrodes, a flexible film which is disposed in the space and has conductivity and power feeding means which alternately feeds power to the pair of flat electrodes, both ends of the flexible film being fastened near different side plates on different flat plates so as to be able to change shapes within the space.

According to a further aspect of the present invention, there is provided a cooling device comprising a magnetic flexible film, both ends of which are held, two magnetic field generating devices which generate magnetic fields according to electric signals and side plates which are mounted between the two magnetic field generating devices, the shape of the magnetic flexible film being changed by the generated magnetic fields.

According to a still further aspect of the present invention, there is provided a semiconductor package including a semiconductor chip containing an electronic circuit, a substrate on which the semiconductor chip is mounted and which has an I/O portion for inputting and outputting electric signals to and from the semiconductor chip and a heat dissipation part which expels heat generated from the semiconductor chip, any one of the cooling devices mentioned above being used for the heat dissipation part.

In the cooling device of the present invention and the semiconductor package on which this cooling device is mounted, the flexible film being in the shape of the letter S, comes into contact with the surface of the electrode which is actuated by means of electrostatic force caused between the powered electrode and the flexible film by alternately feeding power to the flat electrodes. Both ends of the flexible film are fastened near different side plates on different flat plates so that the shape of the flexible film is changeable within the space which is surrounded by the flat electrodes. In this manner, the flexible film is fixed so that it is loose, crossing the gap between the flat plates.

Accordingly, when one flat electrode is actuated, the flexible film comes into contact with the electrode successively from the portion where the flexible film is fastened to the flat plate. Thus, the portion which crosses the gap between the flat plates of the flexible film, is moved along the surface of the flat plate. If the other flat electrode is actuated, the flexible film in contact with the surface of the one flat electrode is separated therefrom and comes into contact with the surface of the other flat electrode. At this time, the portion of the flexible film which crosses the gap, is moved in a reverse direction. By repeating this action, the air heated by a semiconductor package on which the cooling device is mounted is dissipated from the space.

The flexible film repeats contact and separation from the flat electrodes which are heated by the semiconductor package in order to destroy the thermal boundary layer created over the surfaces of the flat electrodes. This action accelerates heat conduction on the surfaces of the flat electrodes and expels the heated cooling medium, introducing a new cooling medium from the surrounding area.

With air cooling by means of a fan, it is well known that the thermal boundary layer formed over the surface of a heat generating object blocks heat conduction from the surface of the heat generating object. Some countermeasures such as increasing the air flow rate or dispersing the air flow have been taken to decrease the effect of the thickness of the boundary layer. The present invention allows such heat to be expelled very effectively because the thermal boundary layer formed over the film in contact with the electrode plate is removed together with the film. In regards to this action, the present invention is considerably different from conventional cooling devices such as a cooling device comprising a reciprocation type fan the end faces of which operate as if they sweep the surface of a substrate by employing a piezo-vibrator.

Use of a flexible film allows the flexible film to reciprocate over the entire surface of the flat electrodes.

If the flexible film is made of a shape memory alloy, the shape of which is changed at a predetermined temperature, when the flat plate on which a semiconductor package is mounted is heated by heat generated from the semiconductor package, the film is separated from the flat plate to which the semiconductor package fits and is moved to an opposite flat plate. If the film comes into contact with the opposite flat plate, it is cooled by the flat plate and is then moved again to the flat plate to which the semiconductor package fit. As a result, the air heated in the cooling device is dissipated.

In an electromagnetic drive type cooling device, a magnetic flexible film which is supported between two magnetic field generating devices is moved up and down by means of magnetic force. Thus, the electro-magnetic drive type cooling device performs the same effect as the aforementioned type using electrostatic force. It is possible to provide a thin structure cooling device by narrowing the gap between the magnetic field generating plates. Additionally, because, in the present invention, the film is driven by a magnetic force, the cooling device can be driven by low voltages below 5 V and easily integrated with an LSI chip.

According to a still another aspect of the present invention, there is provided a computer comprising a substrate on which a plurality of semiconductor packages are mounted, a case which incorporates the substrate, a keyboard which is disposed on a surface of the case to input information, and a display screen, at least one of the semiconductor packages including a heat dissipation part which expels heat to a surface opposite to a surface fitted to the substrate, any one of the aforementioned cooling devices being used for the heat dissipation part.

According to the present invention, by disposing a cooling device of the present invention in a semiconductor package, which is contained in a computer including substrates on which semiconductor packages are mounted, and which generates a large amount of heat, it is possible to suppress a rise in the temperature of the semiconductor package and prevent a rise in the temperature of the substrate, both of which allow the electronic circuits to operate properly.

DESCRIPTION OF THE PREFERRED EMBODIMENTS

Figure 1:
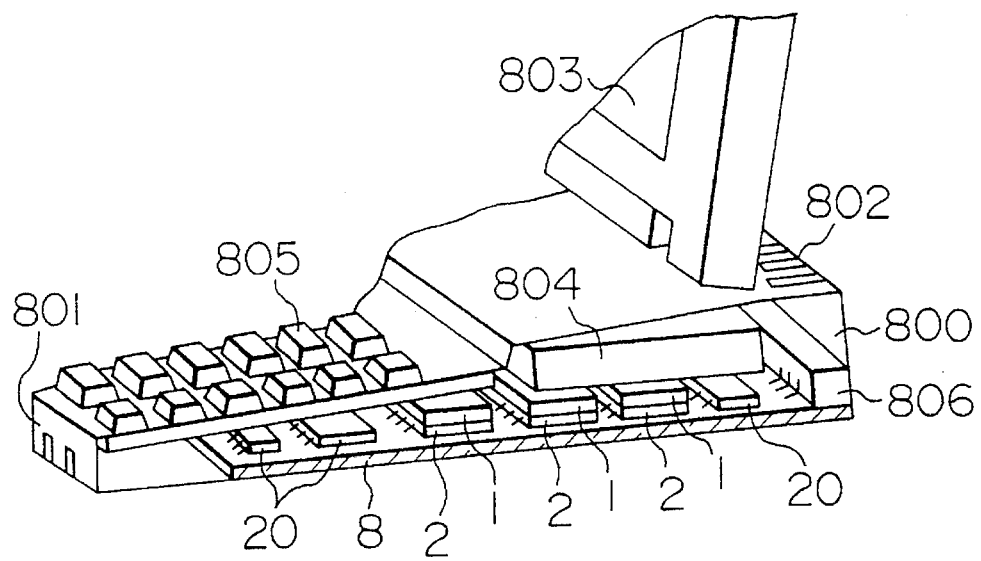
FIG. 1 is a perspective view with a fragmentary cross section of a computer including cooling devices according to the first embodiment of the present invention.

The first embodiment of the present invention will be described with reference to FIGS. 1–6. FIG. 1 is a fragmentary perspective view including an exterior and a fragmentary cross section showing an interior structure of a computer. The computer comprises a case 800 which includes a display screen 803 and a keyboard 805 mounted on a surface of the case, a substrate 8, on which various semiconductor packages and electronic parts are mounted, disposed inside of the case 800, an external connector 806 and a disk drive 804. The case 800 is provided with air ports 801, 802 which are formed on a keyboard side and an external connector side of the case to allow air to circulate in the computer. A plurality of semiconductor packages 2 with high heat generation density and semiconductor packages 20 with low heat generation density are mixedly mounted on the substrate 8 disposed in a flat space inside of the case 800.

The substrate 8 is a multi-layer wiring board on which signal lines and power lines are disposed in multi-layers with insulating layers interposed. The semiconductor packages 2, 20 and other electronic parts are electrically connected to each other by means of through holes provided in the substrate and wirings placed on the surface layer.

Figure 2:
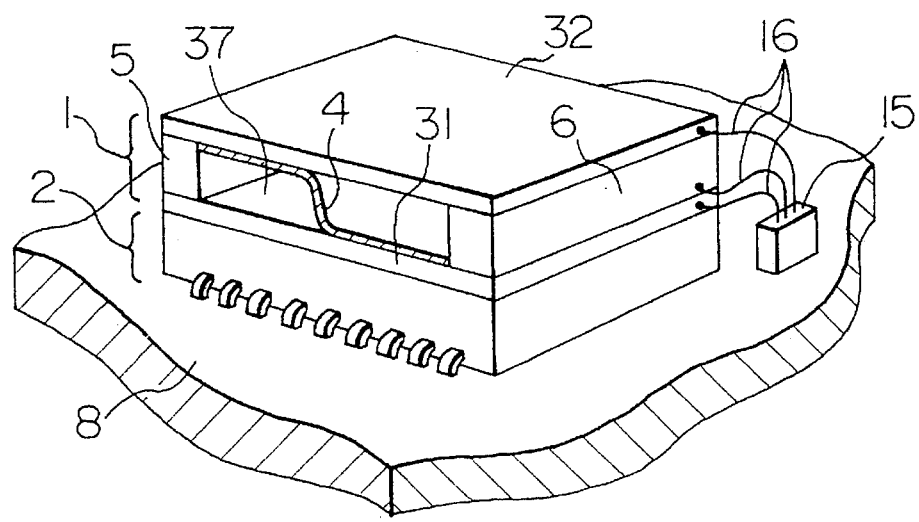
FIG. 2 is a perspective view showing a condition of the cooling device which is mounted on a semiconductor package.

Cooling devices 1 are bonded to respective semiconductor packages 2 which have high heat generation density by high heat conductive adhesive on a side, opposite the substrate 8, of the semiconductor package. FIG. 2 shows an expanded view of the semiconductor package 2 on which the cooling device 1 is mounted. The cooling device 1 comprises two flat electrodes 31, 32 having insulating layers formed on the surfaces thereof and disposed in parallel with each other with a gap therebetween, side plates 5, 6 which are arranged at the ends of the flat electrodes so as to define a space 37 and a flexible film 4 both ends of which are fastened by the flat electrodes and the side plates. One end of the flexible film 4 is fastened by means of the flat electrode 31 and the side plate 6 and the other end of the flexible film 4 is fastened by means of the flat electrode 32 and the side plate 5. Namely, the flexible film is disposed so as to cross the space 37 while an intermediate section of the film is elastically deformed in a shape of the letter S.

The construction and principle of operation of the present embodiment will be described further in detail with reference to FIGS. 2, 3 and 4. The flexible film 4 is made of an electric conductive material. Three wires 16 which are introduced from the two flat electrodes 31, 32 and the flexible film 4 are connected to an output section of a booster circuit, a grounding wire 100 and a switch circuit 102 through a connector 15. The electrodes 31, 32 are made of a single-crystal silicon wafer. An insulating film having a thickness of 0.5–2.0 μm is formed on the surface of the silicon wafer by heating to oxidization. The thickness of the silicon wafer used for the present embodiment is about 0.35 mm. The flat electrodes are 20 mm square, the same size as the semiconductor package to be cooled. Although the gap between the two flat electrodes is 1.30 mm, it can be changed arbitrarily by changing the thickness of the ceramic side plate 5. The flexible film 4 is made of a stainless steel foil which is rolled to 5 μm in thickness. In the present embodiment, the entire thickness of the cooling device is 2 mm, providing a very thin structure.

The principle of the operation of the S shaped section according to the present embodiment is as follows. The flexible film 4 is always electrically grounded. An output voltage of the booster circuit is alternately applied to the upper and lower flat electrodes 31, 32 of the cooling device through a switch circuit which controls voltage applying time period.

Figure 3:
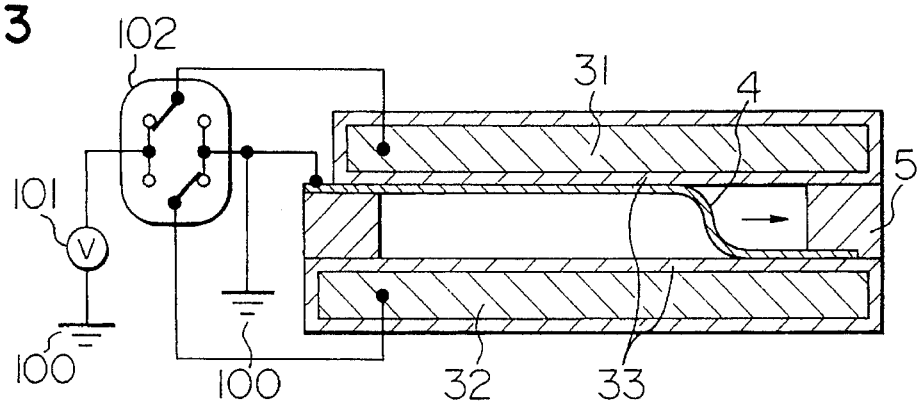
FIG. 3 is an explanatory view showing construction of the cooling device and the driving principle of the cooling device.
Figure 4:
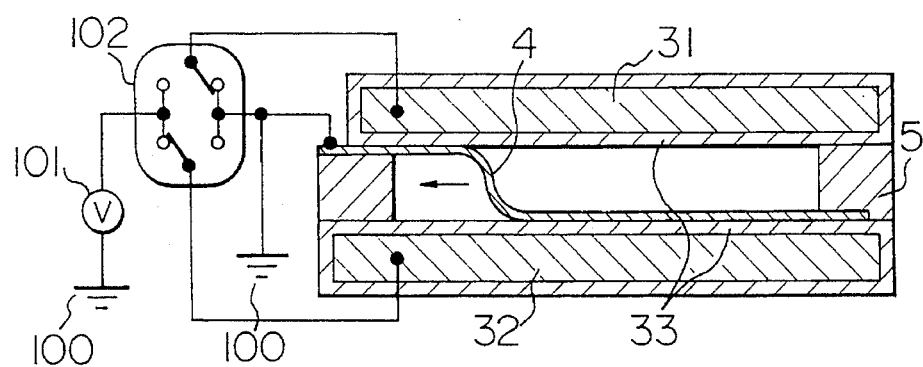
FIG. 4 is a further explanatory view showing construction of the cooling device and the driving principle of the cooling device.

As shown in FIG. 3, when a voltage is applied to the upper flat electrode 31, an electrostatic force is produced between the upper flat electrode and the flexible film 4. As a result, the S shaped section of the flexible film is moved in a direction to increase a contact area of the flexible film with the upper flat electrode 31, that is, in the rightward direction as shown in FIG. 3. Conversely, when a voltage is applied to the lower flat electrode 32, the flexible film is moved by the same action in a direction to increase a contact area of the flexible film with the lower flat electrode 32, that is, in the leftward direction as shown in FIG. 4.

By applying a voltage alternately to a pair of the flat electrodes, the flexible film 4 which is held between the flat electrodes is moved to the right/left to expel air in the space surrounded by these flat electrodes, thereby introducing new air from outside. As a result, air contained in the cooling device, which is heated by heat generated by the semiconductor package 2 on which the cooling device is mounted is expelled, consequently cooling the semiconductor package 2.

AC voltage 100 V is converted to DC voltage by means of an AC/DC conversion adaptor to obtain an input voltage for the computer. A DC voltage of 5 V is input to the computer in the present embodiment. Part of the power input to the computer is converted to a DC voltage of 70 V by means of the booster circuit provided in the computer for the display screen. This 70 VDC is used to drive the cooling device.

Figure 5:
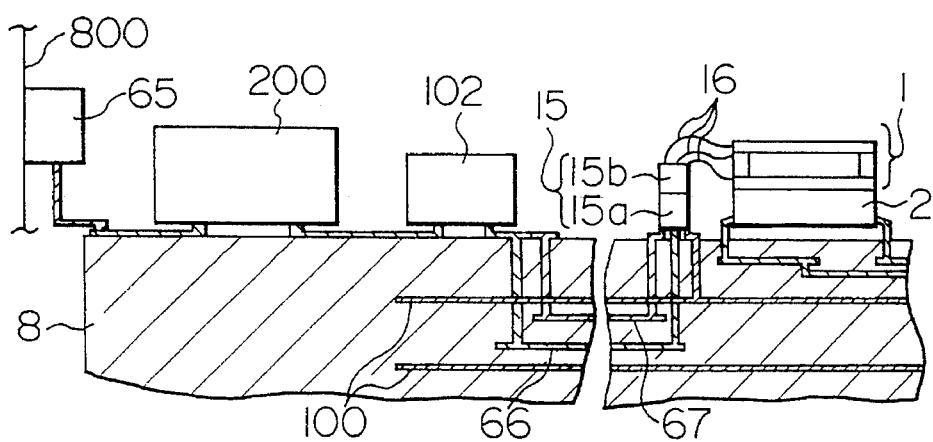
FIG. 5 is a schematic sectional view showing electrical connection between a driving power supply and the cooling device.

FIG. 5 is a schematic sectional view showing electrical connections between a driving power supply and the cooling device. The booster circuit 200 is disposed near a power input section 65 for the substrate 8 and part of an output voltage from the booster circuit 200 is introduced through a power line contained in the substrate 8 to the switch circuit 102 which controls time period during which the voltage is applied to the cooling device 1. The respective voltages for the upper electrode and the lower electrode of the cooling device, which have been obtained by voltage conversion by means of the switch circuit 102, are input to different power lines 66, 67 in the substrate 8. Then, the voltages are supplied to the cooling device 1 through a connector 15a which is connected to a through hole provided in the substrate 8 and a connector 15b which has wires connected to both electrodes of the cooling device and the flexible film.

In the substrate 8, the power lines 66, 67 for the cooling device are disposed separately. Grounding layers 100 are disposed via an insulating layer on both sides of the layer where these power lines are wired to prevent the switching noise caused by a change of the driving voltage from influencing the signal lines.

Figure 6:
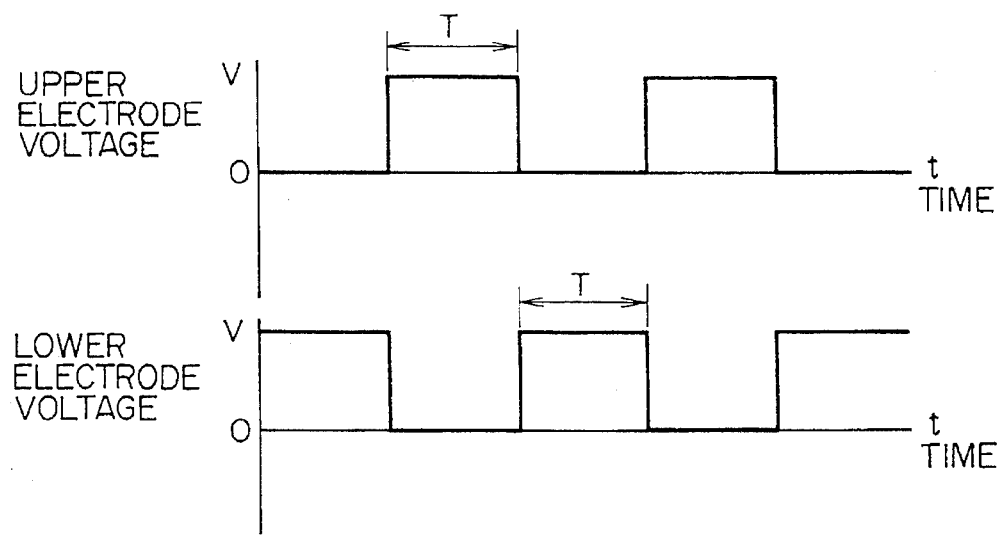
FIG. 6 is a diagram showing a waveform of voltages which are applied to upper and lower electrodes of the cooling device.

FIG. 6 shows an example of voltage change to the cooling device with the passage of time.

Referring to FIG. 6, the frequency of the reciprocation of the S shaped section of the flexible film in the cooling device is changed by changing the time period during which the voltage is applied to the respective electrodes and magnitude of the applied voltage. In the construction according to the present embodiment, the moving speed of the flexible film 4 is 5 m/s when the applied voltage is 70 V.

As regards the present embodiment, an optimum reciprocation frequency of the S shaped section of the flexible film for the cooling device is 20 Hz. It is permissible to dispose the booster circuit separately from the substrate which includes the semiconductor packages and the electronic parts. Although, according to the present embodiment, he input voltage to the computer is 5 VDC and the voltage for driving the cooling device is 70 VDC, these voltages are not restricted to these values. In particular, it is necessary to adjust the voltage for driving the cooling device to cope with the required responsive frequency of the flexible film, depending on the material, thickness and shape of the flexible film. Although, in the present embodiment, the time period for applying voltages to the upper and lower electrodes of the cooling device are the same, the respective voltages being applied alternately to each electrode, it is permissible to change the respective time period for applying the upper and lower electrodes in response to the heat generation conditions of the semiconductor packages, or provide continuously or intermittently a time for interrupting an application of voltage on the respective electrodes.

Although, in the present embodiment, the power input section 65 is fit to the case of the computer, it is permissible to fix the power input section on the substrate 8.

Although, in the present embodiment, power to the cooling device is supplied by means of the power line contained in the substrate, it is permissible to connect an output line and a grounding wire from the switch circuit 102 and connect this connector with the connector provided on the cooling device by means of a lead wire over the substrate. In the latter case, the power line is connected through a noise insulating ferrite member. This protects the signal line from being affected by switching noises caused by changes of the driving voltage.

According to the present invention, it is possible to dissipate heat generated by the semiconductor package by driving the cooling device which is mounted on the semiconductor package.

Additionally, according to the present invention, it is possible to obtain a thin cooling device. Thus, when the cooling device is mounted on the semiconductor package, it is possible to reduce the overall thickness.

Further, it is not necessary to provide another power supply for the cooling device to drive the cooling device by using the voltage which is used in the computer.

The second embodiment of the present invention will be described with reference to FIG. 7. According to the present embodiment, as compared with the first embodiment described above, the substrate shown in FIG. 5 includes a conversion circuit for obtaining 1 kHz AC voltage apart from the booster circuit for 70 VDC; and the output of the conversion circuit is input to the switch circuit 102. When AC voltage is applied to the cooling device, it is necessary to secure a sufficiently larger AC frequency than the reciprocation frequency of the flexible film. Thus, the AC frequency for this embodiment is made to be 1 kHz.

Figure 7:
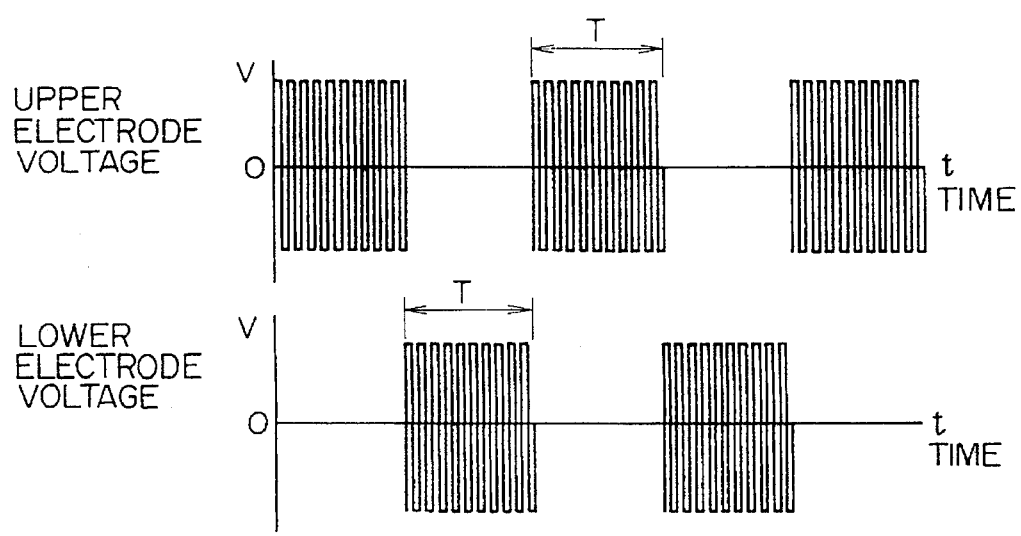
FIG. 7 is a diagram showing a waveform of voltages which are applied to upper and lower electrodes of a cooling device according to the second embodiment of the present invention.

FIG. 7 shows changes of the voltages applied over time to each of the upper and lower electrodes of the cooling device through the switch circuit 102. As in the first embodiment described above, the time period for applying voltages to the upper and lower electrodes are designated as T, and then AC voltage of 1 kHz is applied to the respective electrodes alternately for T time period each.

As a result of changing the voltage application time period T, as in the first embodiment described above, an optimum cooling performance was obtained when the frequency of the reciprocation of the S shaped section was 20 Hz.

According to the present invention, a disadvantage of DC voltage driving has been solved. According to the disadvantage of DC voltage driving, the insulating film is likely to be electrically charged because the transmission of electric charges within the insulating material is small. Further, the present invention tends to prevent the insulating film from being electrically charged.

Figure 8:
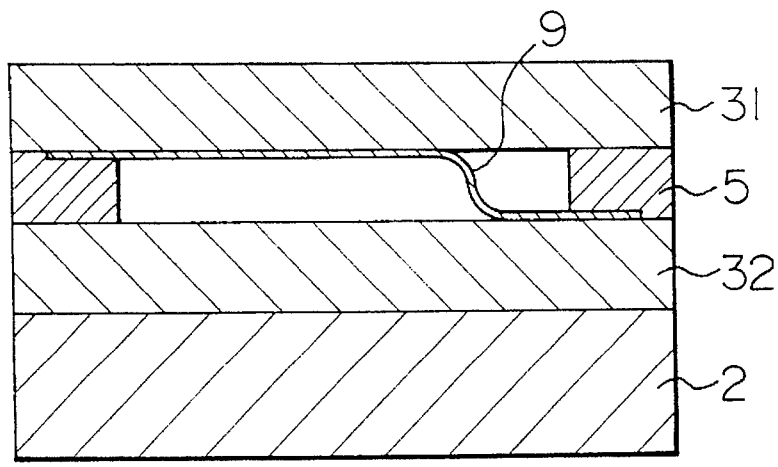
FIG. 8 is an explanatory view showing driving principle of a cooling device according to the third embodiment of the present invention.
Figure 9:
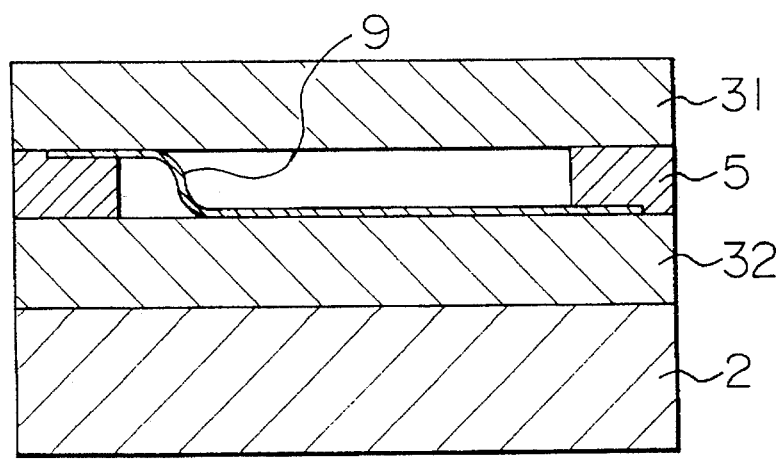
FIG. 9 is an explanatory view showing the driving principle of the cooling device according to the third embodiment of the present invention.

The third embodiment of the present invention will be described with reference to FIGS. 8 and 9. In the present embodiment, the flexible film 9 is made of shape memory alloy foil. The foil maintains the shape shown in FIG. 9 when the temperature is below $T_1$ and changes to the shape shown in FIG. 8 when the temperature is over $T_2$. Where $T_2 > T_1$. When the foil 9 is heated to temperature over $T_2$ by the semiconductor package 2, the foil is changed to the condition shown in FIG. 8. When the foil comes into contact with the upper flat plate, the foil temperature falls below $T_1$, so that the foil returns to the condition shown in FIG. 9 to be heated. As described above, according to the present embodiment, the film driving energy is supplied by heat caused by the semiconductor package 2 itself, and thus electric wiring for driving the film from outside is not required.

Figure 10:
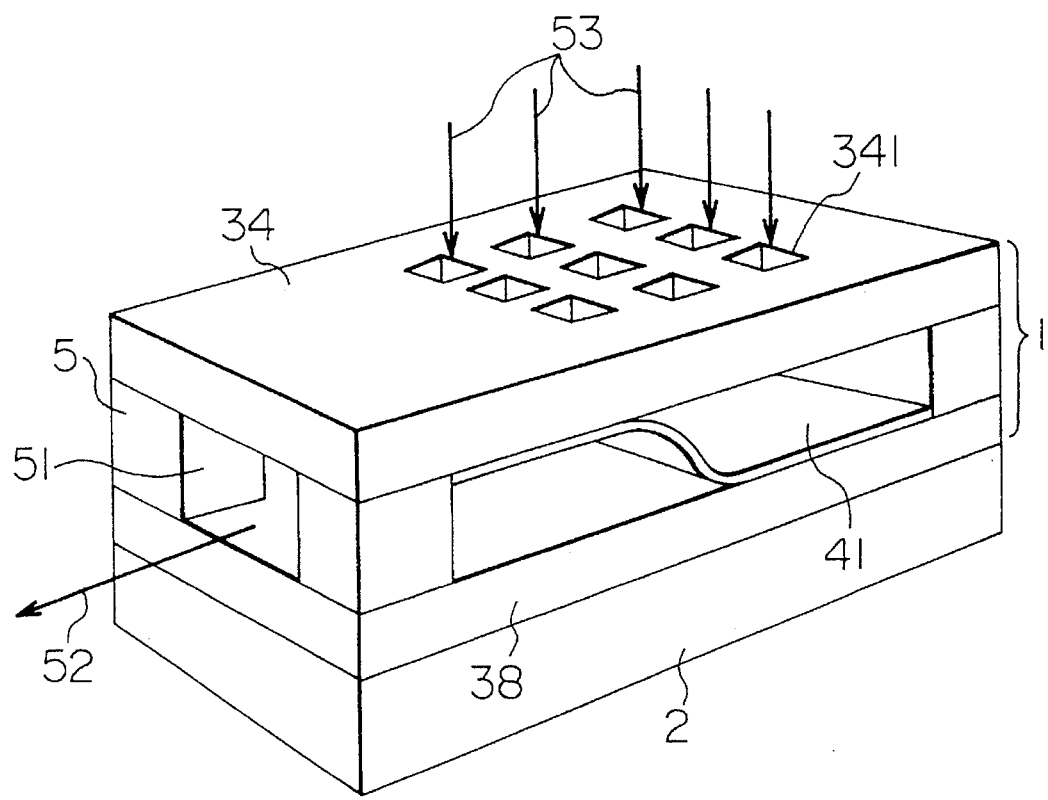
FIG. 10 is a perspective view showing a cooling device according to the fourth embodiment of the present invention which is mounted on a semiconductor package.

FIG. 10 shows the fourth embodiment of the present invention. The cooling device of the present embodiment causes cooling action when voltage is applied to the upper and lower flat electrodes 34, 38 alternately as in the first embodiment described above. The upper flat electrode 34 is formed with a plurality of openings 341. These openings 341 act to introduce cool air 53 from above into the space and expel the heated air therethrough by the action of the film 41. Further, openings 51 provided on the side plates 5 act to expel the heated air 52 therethrough.

This arrangement prevents the expelled heated air from circling around and returning to the interior between the flat electrodes. Although, in the present embodiment, an electric conductive film 41 is used, the same effect can be obtained if the shape memory alloy shown in FIG. 3 is employed.

Although, in the present embodiment, there are provided a plurality of openings 341, it is permissible to provide the flat electrode 34 with a single opening.

Figure 11:
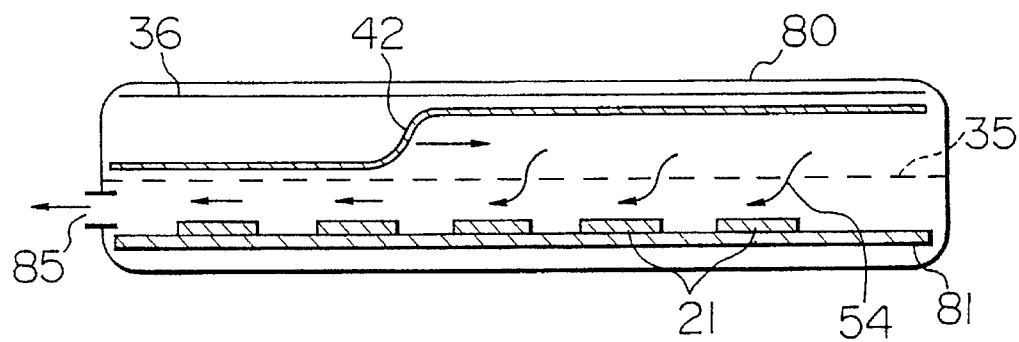
FIG. 11 is a sectional view of a case of a computer including a cooling device according to a fifth embodiment of the present invention.

FIG. 11 shows the fifth embodiment of the present invention. A flat electrode 35 having a plurality of openings is disposed so that the electrode faces a substrate 81 on which a plurality of the semiconductor packages 21 are mounted and another flat electrode 36 is disposed behind the flat electrode 35. As a contact area between the flexible film 42 and the flat electrode 35 having the openings increases, the air is expelled through the openings. The expelled air forms air flow 54 for cooling the semiconductor package, and then is exhausted from an opening 85 provided on a case 80.

According to the present embodiment, it is possible to create forced convection inside the thin case with low power consumption. If the opening provided on the case is only one like the opening 85, air flow enters and goes out through the same opening. Thus heated air exhausted previously is sucked in again, thereby reducing the cooling effect.

Figure 12:
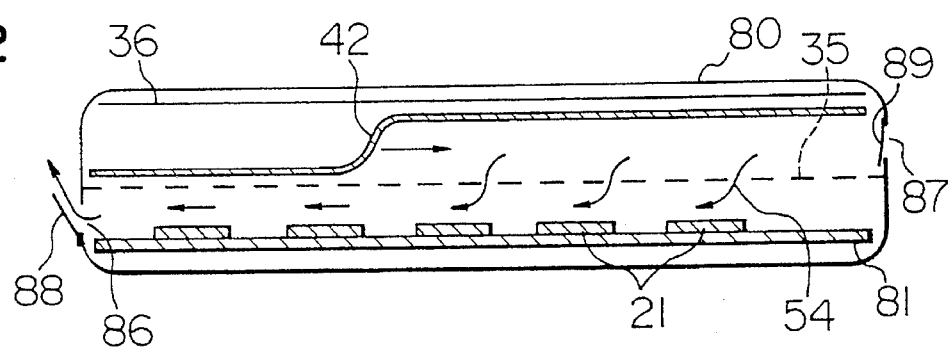
FIG. 12 is a sectional view of the case of the computer including the cooling device according to the fifth embodiment of the present invention.

FIG. 12 shows an improvement of the fifth embodiment. Openings 86, 87 are provided at different positions and check valves 88, 89 are provided on the openings, respectively. The check valve 88 is provided on the outside of the case 80 for the opening 86 for exhausting air. The check valve 89 is provided inside of the case 80 for the opening 87 for sucking air therein. These check valves may be leaf springs. They need only to be located so as to come into contact with the case 80 when the flexible film is inactive, and to be elastically deformed by a pressure differential between the inside and outside of the case when the flexible film is active.

Because check valves are provided on the openings, the opening 86 is opened by the check valve 88 when heated air flow is exhausted by an action of the flexible film 42 through the opening 86. When the flexible film 42 is moved so as to increase the contact area between the film and the flat electrode 36, the check valve 89 is bent inward and the opening 87 is opened, so that new air flow enters into the case 80.

Figure 13:
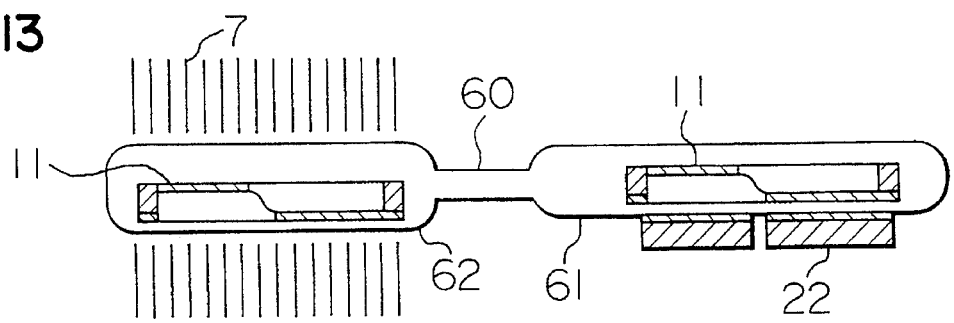
FIG. 13 is a sectional view of a heat pipe incorporating a cooling device according to the sixth embodiment of the present invention.

FIG. 13 shows the sixth embodiment of the present invention. Heat caused from the semiconductor package 22 is introduced through a heat pipe 60 and is dissipated outside of the computer via fins 7. The cooling devices 11 are incorporated in the heat pipe of low and high temperature sides. In the respective sides, the cooling medium, in either a gas or liquid state, is in contact with the inside walls of the pipe. When the cooling devices are actuated by electrostatic force in the same manner as the embodiments 1, 4 and 5, the cooling devices agitate the cooling medium to improve heat conduction between the wall and the cooling medium. The present embodiment can be realized provided that a very small cooling device can be produced.

Because the present embodiment improves heat conduction efficiency, it is possible to reduce the size of the heat pipe.

The flexible film which is used for the first–sixth embodiments may be made of a resin film having a metal layer deposited on the surface as well as the metallic foil mentioned previously. The resin film can be actuated by electrostatic force like the metallic film. The cooling device can be assembled mechanically so as to form the metal rolled material or resin material in the shape of an S. Additionally, it is permissible to float metal deposited by sputtering on the flat electrode from the surface of the flat electrode in a subsequent process to separate a formed layer (sacrificial layer etching method).

The material of the flat electrode may not only be silicon single-crystal wafer as described above, but may also be produced by forming an electrode with conductive material on the entire surface of a flat material and then coating the surface with insulating material. A possible combination is, for example, ceramics as structural material, metal as electrode material and resin as insulating material. If the resistance of a conductive material is sufficiently high, it is possible to generate an electrostatic force between a film and the electrode material even if no insulating material is applied to the surface. The material which can be used for the electrode, may be, for example, ceramics such as SiC.

Although, in the first–sixth embodiments, the flat electrodes are disposed in parallel with each other, it is not necessary to dispose the flat electrodes in parallel, since the same effect can be achieved even if they are angularly disposed with respect to each other.

Figure 14:
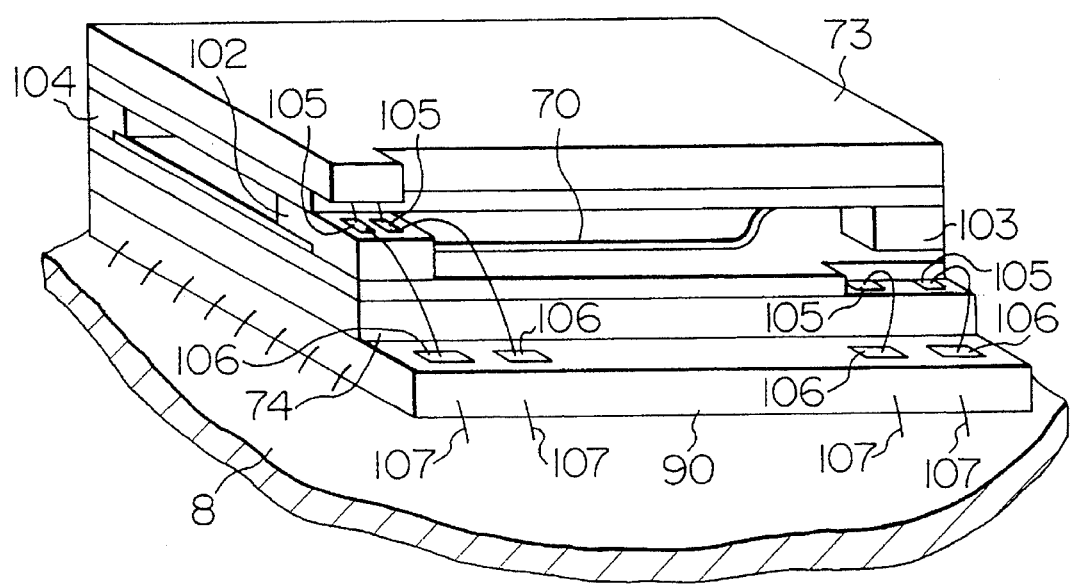
FIG. 14 is a perspective view of an electro-magnetic drive type cooling device according to the seventh embodiment of the present invention.

The seventh embodiment of the present invention will be described with reference to FIGS. 14, 15a, 15b. FIG. 14 is a perspective view showing the construction of the seventh embodiment of the cooling device. The cooling device comprises a flexible magnetic film 70, side plates 103, 104, 102 which hold both ends of the film, upper and lower magnetic field generating units 73, 74 which drive the film held by the side plates 102, 103, 104 and power supply pads 105 which supply electric power to the magnetic field generating units. The cooling device is mounted on a semiconductor package 90, to be cooled, so that the cooling device is integrated with the semiconductor package 90. The power supply pads 105 are connected to power pads 106 which are formed on the semiconductor package 90 through gold wires. The power supply pads 106 are connected to leads 107 which are provided on the semiconductor package 90. Except for the portions of the magnetic film held by the side plates, the magnetic film is held so that the film is partially bent in the shape of the letter S. The portion which is bent in the shape of the letter S is elastically deformed.

The magnetic field generating units 73, 74 drive the magnetic film so that the bent portion is moved. When a voltage of 5 V is supplied to the upper magnetic field generating unit 73, a top surface of the bent portion of the magnetic film is moved so that the top surface successively comes into contact with a bottom surface of the upper magnetic field generating unit 73. On the other hand, when the voltage to the upper magnetic field generating unit 73 is turned off and a voltage of 5 V is supplied to the lower magnetic field generating unit 74, the S-shaped bent portion of the magnetic film is moved in reverse to the direction mentioned above. These actions are repeated in an interval of several hundreds milli seconds to several tens of milli seconds in order to expel heated air caught between the upper and lower magnetic field generating units. As a result, the semiconductor package which is disposed under the cooling device is cooled.

Figure 15A:
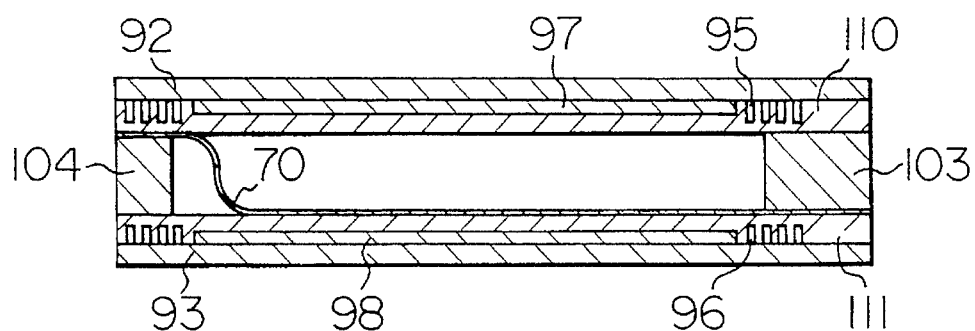
FIGS. 15a and 15b are a sectional view of the electro-magnetic drive type cooling device according to the seventh embodiment of the present invention and a plan view of a magnetic field generating unit, respectively.
Figure 15B:
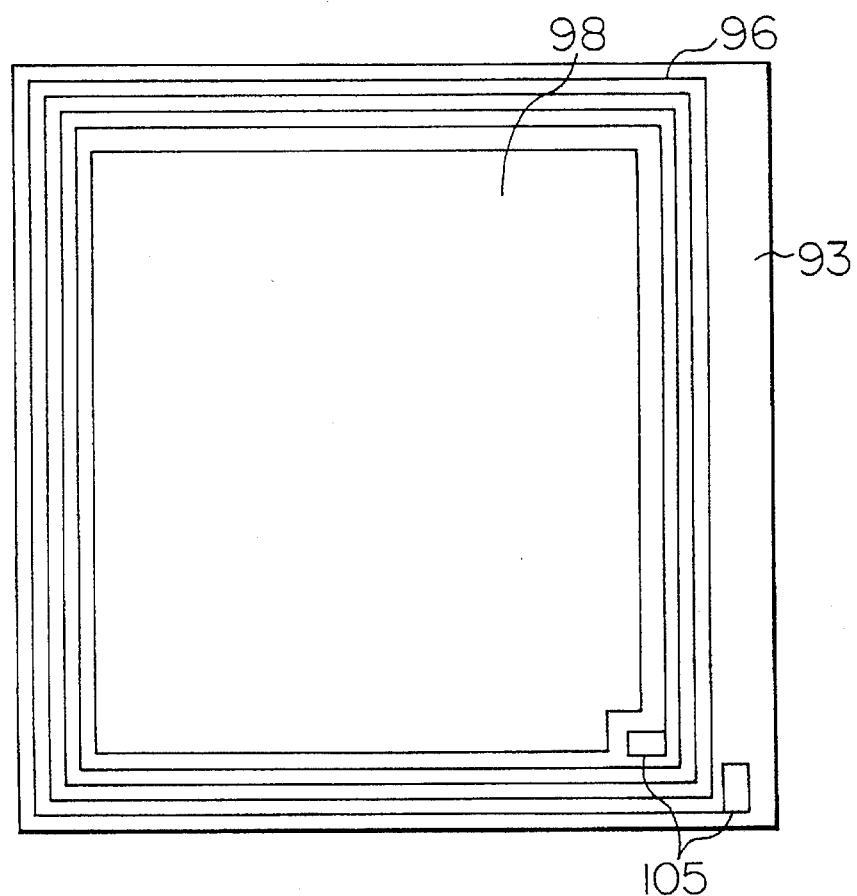

FIG. 15a is a sectional view of the cooling device according to the seventh embodiment. FIG. 15b shows the magnetic field generating plate which is a major part of the magnetic field generating unit. The cooling device measures 20 mm long, 20 mm wide, 2 mm–5 mm high. These dimensions are only an example and must be almost the same as the size of the semiconductor package which is required to be cooled. The magnetic film 70 is made of Permalloy foil measuring 20 mm long, 15 mm wide, 5 µm thick. The upper and lower magnetic field generating units comprise insulating substrates 92, 93, coil patterns 95, 96 and magnetic substances 97, 98.

The coil patterns 95, 96 of the magnetic field generating units are produced by using semiconductor microprocessing technology. After copper foil of 50–100 µm is bonded to the insulating substrates 92, 93 of 500 µm in thickness, several tens turns of coil patterns 95, 96 of 50–100 µm in width are formed by photolithography. Then, nickel of 50–100 µm in thickness or Permalloy magnetic substance 97, 98 is bonded inside of the coil patterns 95, 96.

Finally, to insulate between the coils and between the coil and the magnetic film, resin 110, 111 such as polyimide or silicon resin which has heat resistance of over 200° C. is coated on the surface of the magnetic field generating plate, that is, the surfaces of the coil pattern and the magnetic substance. Silicon oxide or silicon nitride which has a higher withstand voltage than these resins may be used for this insulation coating. It is possible to change the thickness of the copper foil, the width of the coil or the number of the turns in response to the magnitude of the magnetic force required to drive the magnetic film. The coil patterns 95, 96 and the magnetic substances 97, 98 may be produced by electrolytic plating as well as by the above mentioned method.

Figure 16:
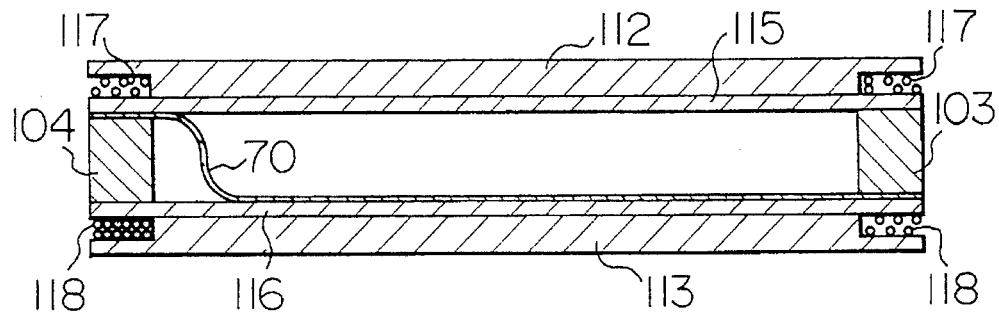
FIG. 16 is a sectional view of an electro-magnetic drive type cooling device according to the eighth embodiment of the present invention.
Figure 17A:
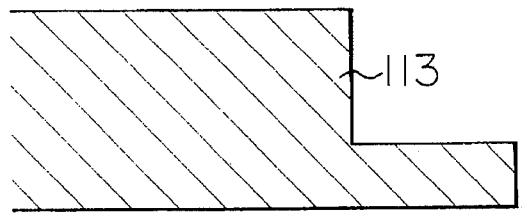
FIGS. 17a, 17b and 17c are diagrams showing a method for producing a magnetic field generating unit of the electromagnetic drive type cooling device according to the eighth embodiment of the present invention.
Figure 17B:
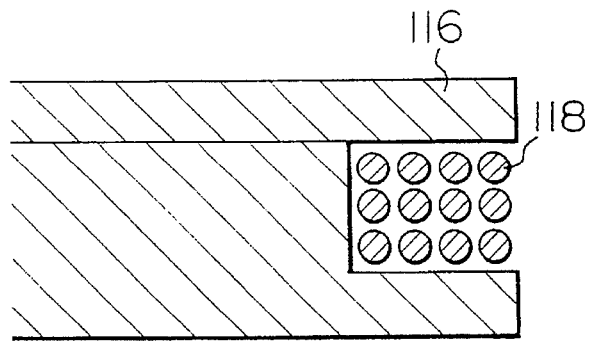
Figure 17C:
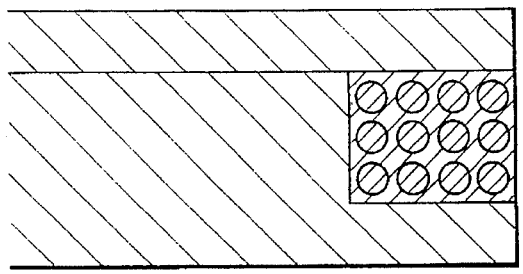

FIG. 16 is a sectional view of the eighth embodiment of the present invention. FIGS. 17a, 17b and 17c are process diagrams which show the method of producing a magnetic field generating plate which is a major part of the magnetic field generating unit. The cooling device shown in FIG. 16 is a modification of the magnetic field generating unit of the cooling device shown in FIGS. 15a, 15b. The magnetic field generating unit comprises a magnetic substrate 112, 113 having cutout sections on the outside edge, a magnetic substrate 115, 116 both surfaces of which are flat and a coil 117, 118. FIGS. 17a, 17b and 17c show the method for producing the cooling device.

The flat magnetic substrate 116 is bonded to the magnetic substrate 113 with the cutout section on the outside edge, to form a groove on a periphery thereof. In this groove, insulation coated copper wire is wound several hundred turns to form the coil 118 which is molded with a resin. The magnetic substrate with the cutout section on the edge and the flat magnetic substrate are made of Permalloy, nickel, cobalt or iron. The coil is made of copper wire having a diameter of less than 0.2 mm. If the depth of the groove is small, it is possible to use a substrate having a concave groove on its side face.

Because the coil patterns of the cooling device shown in FIG. 15a are produced by using photolithography, the thickness of the coil pattern and the number of turns are restricted. The strength of the magnetic field is proportional to the number of turns of coil and a current flowing in the coil. Accordingly, a magnetic field generating plate using a coil produced by photolithography is suitable for a thin cooling device but it has a limitation in the strength of magnetic field which can be generated by it.

On the other hand, the assembly-type cooling device which uses copper wire is capable of increasing the number of turns of and the current flowing through the coil as compared with a coil produced by photolithography. Thus a stronger magnetic field can be produced but the thickness of the device exceeds 4 mm.

In a magnetic field generated by the coil, magnetic force acting on the magnetic film depends on the gradient of the magnetic field. Because the electromagnetic drive type cooling device shown in FIGS. 15a, 15b, 16, 17a, 17b and 17c uses a pair of the upper and lower flat magnetic field generating plates, the gradient of the magnetic field in the magnetic film is low, so that a magnetic force acting on the magnetic film is small.

Figure 18A:
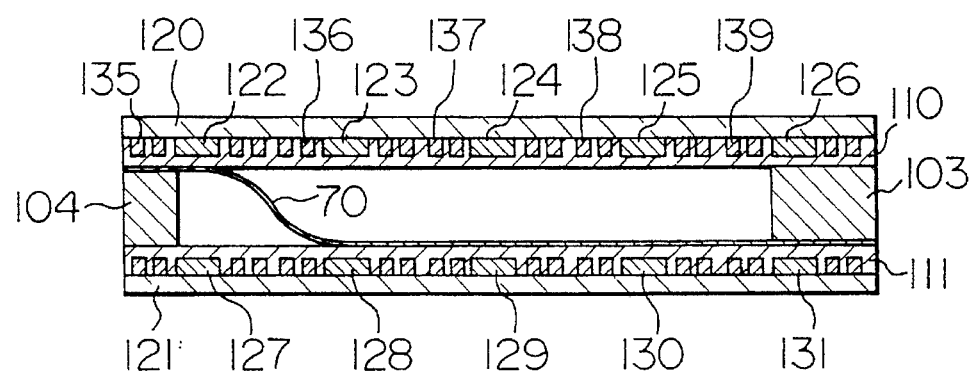
FIGS. 18a and 18b are a sectional view of an electromagnetic drive type cooling device according to the ninth embodiment of the present invention and a plan view of a magnetic field generating unit, respectively.
Figure 18B:
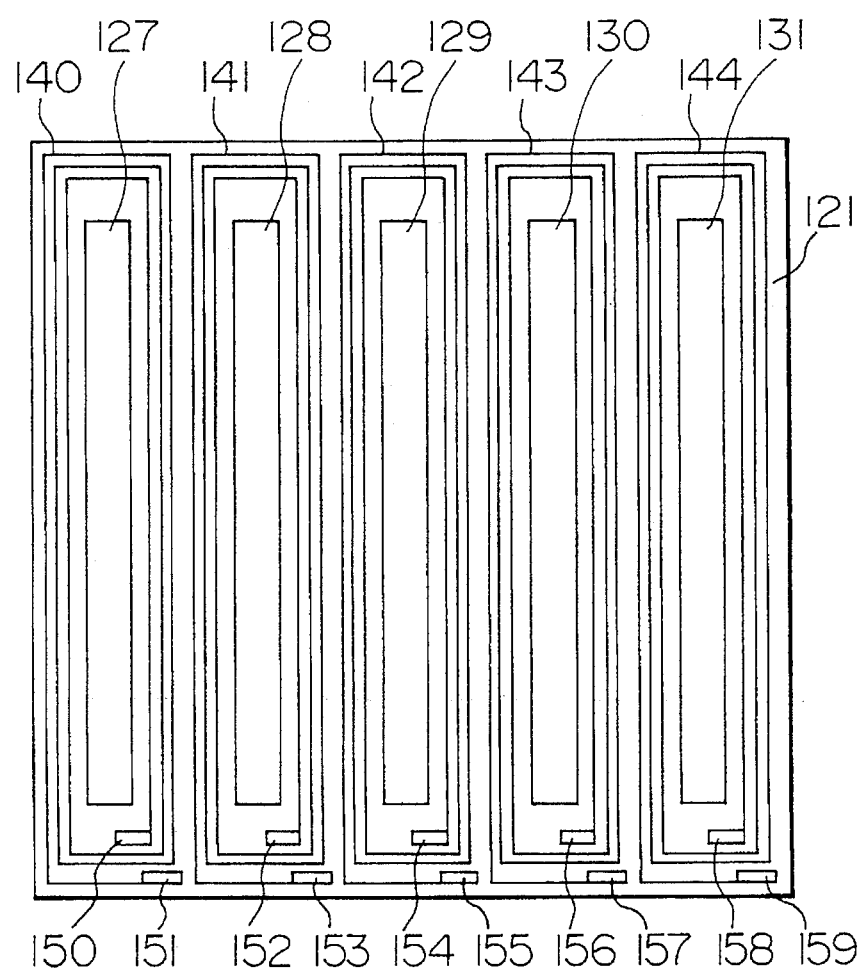

FIGS. 18a and 18b show the ninth embodiment of the present invention in which the gradient of the magnetic field in the magnetic film is increased by dividing the upper and lower magnetic field generating plate into a plurality of sections.

FIG. 18a is a sectional view of the electromagnetic-drive-type cooling device and FIG. 18b shows a division-type magnetic field generating plate which is a major part of the magnetic field generating unit. The electromagnetic-drive-type cooling device shown in FIGS. 18a and 18b includes five magnetic field generating units which are obtained by dividing the magnetic field generating unit of the cooling device shown in FIGS. 15a, 15b into five stripes. The magnetic field generating unit comprises substrates 120, 121, magnetic substances 122–131 and coils 135–144. The supplying of power to each magnetic field generating unit is performed by power supply pads 150–159.

FIG. 18a shows a state in which magnetic fields are generated from the upper and lower magnetic substances 122 and 128–131, respectively. This state is obtained by feeding current to the upper coil 135 and the lower coils 141–144.

In this case, the left portion of the S shaped section is attracted by the upper magnetic substance 122 and the right portion of the S shaped section is attracted by the lower magnetic substances 128–131. According to the present embodiment, the divided magnetic field generating unit produces magnetic fields to move the magnetic film. For example, when moving the S shaped section to the right, by feeding current to the upper 135–139 successively, magnetic fields are produced in the magnetic substances 122–126 in order. The currents fed to the lower coils, 140 to 144 in order, are turned off accompanied by the movement of the magnetic film. To move the S shaped section in the reverse direction to the left, current is fed in reverse order as described above.

Because the division type magnetic field generating unit includes divided magnetic field generating sections, the gradient of the magnetic field at the magnetic film which is produced by the divided magnetic field generating section is larger than the flat plate type magnetic field generating unit. Thus, use of the division type magnetic field generating unit enables the S shaped section of the magnetic film to be moved rapidly. The division type construction shown in FIGS. 18a, 18b is applicable to the eighth embodiment which uses copper coils. The number of divided magnetic field generating units are determined in accordance with the size of the cooling device and the speed of the movement of the magnetic film.

A magnetic substance has a property referred to as form antisotropy. For example, if the magnetic substance is a cylinder, the magnetic substance is readily magnetized along the longitudinal axis of the cylinder. That is, it tends to be magnetized along the length of the substance. The magnetic field generating units of the electromagnetic drive type cooling devices shown in the seventh and the present embodiment employ thin sheets of a magnetic substance, which produce magnetic fields by feeding current to coils disposed about the thin magnetic sheets. Thus, in the seventh and present embodiments, the direction of magnetization of the thin magnetic sheet is the same as that of the normal line (extending along the thickness of the sheet), and thus it is unlikely to be magnetized.

Figure 19:
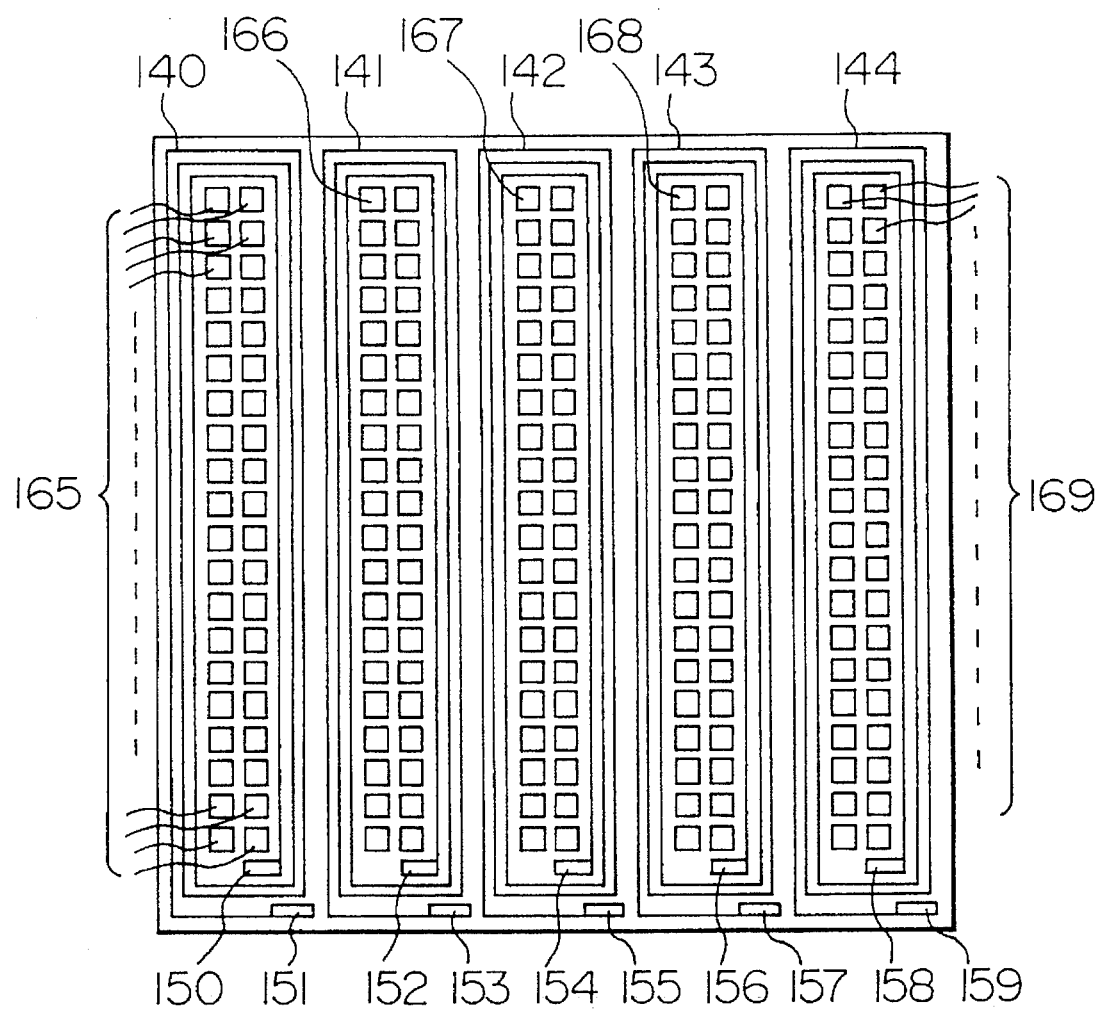
FIG. 19 is a plan view of a magnetic field generating unit of an electromagnetic drive type cooling device according to the tenth embodiment of the present invention.

FIG. 19 shows the construction of the cooling device in which the thin magnetic sheets of the magnetic field generating unit are divided into a plurality of small sections so that the thin magnetic sheets are likely to be magnetized along the normal line of the thin sheet. FIG. 19 is a plan view of the magnetic field generating plate showing a condition in which the thin magnetic sheet is divided into a plurality of small sections. A sectional view of the cooling device according to the present embodiment is omitted because this is almost the same as the ninth embodiment described above. As shown in FIG. 19, according to the present embodiment, magnetic substances 165–169 are divided into 40 small sections. Thus, the respective magnetic substances are more likely to be magnetized vertically relative to the substrate as compared with the construction shown in the sixth embodiment. As a result, the present embodiment forms a stronger magnetic field than the aforementioned embodiment. Naturally, the number of divisions of the magnetic substances are appropriately changed in accordance with the size of the cooling device and the required strength of the magnetic field.

Figure 20A:
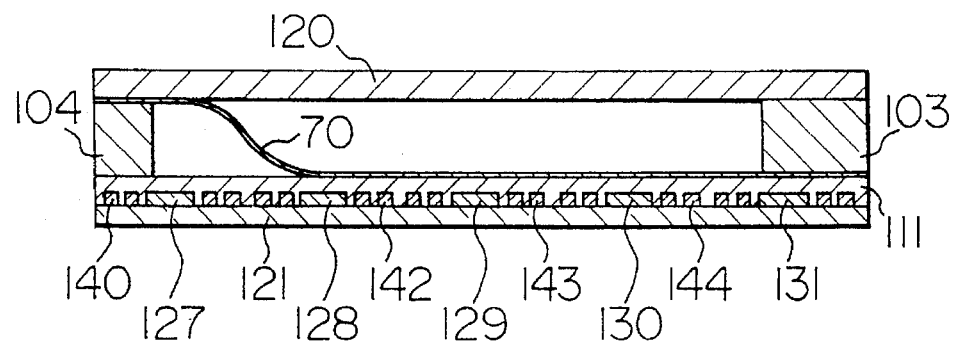
FIGS. 20a and 20b are a sectional view of an electromagnetic drive type cooling device according to the eleventh embodiment of the present invention and an explanatory view showing condition of magnetization of a magnetic film used in the cooling device, respectively.
Figure 20B:
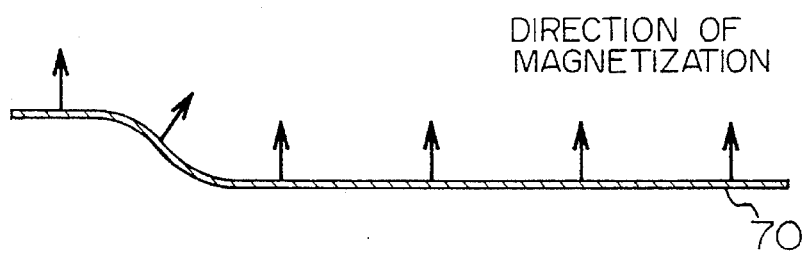

FIGS. 20*a*, 20*b* show the eleventh embodiment of the present invention. FIG. 20*a* shows a sectional view of the electromagnetic drive type cooling device according to the present embodiment and FIG. 20*b* shows the directions of the magnetization of the magnetic film. The electromagnetic drive type cooling device of the present embodiment is a partial modification of the electromagnetic drive type cooling device of the ninth embodiment. Differences between the former and latter embodiments are as follows.

According to the electromagnetic drive type cooling device of the present embodiment:

(1) the magnetic film is made of a magnetic substance (permanent magnet) having a high coercive force;

(2) the magnetic field generating unit is mounted on a single side and a magnetic field is produced with AC current.

In the seventh–tenth embodiments described above, a plurality of the upper and lower magnetic field generating units are employed to drive the magnetic film. This is because Permalloy having a small coercive force is used for the magnetic film. If a magnetic substance (permanent magnet) which holds magnetization along the normal line of the film as shown in FIGS. 20*a*, 20*b* is used, the magnetic film can be moved up and down by only reversing the line of magnetic force going through the film. A reversal of the line of magnetic force can be obtained by applying AC voltage to one magnetic field generating unit. Thus, in the electromagnetic type cooling device of the present embodiment, the magnetic film can be driven by means of a single magnetic field generating unit. Although it is possible to employ either the flat plate type or the division type shown in the seventh–tenth embodiments, for the magnetic field generating unit, the division type produces a larger magnetic force to drive the film.

Figure 21:
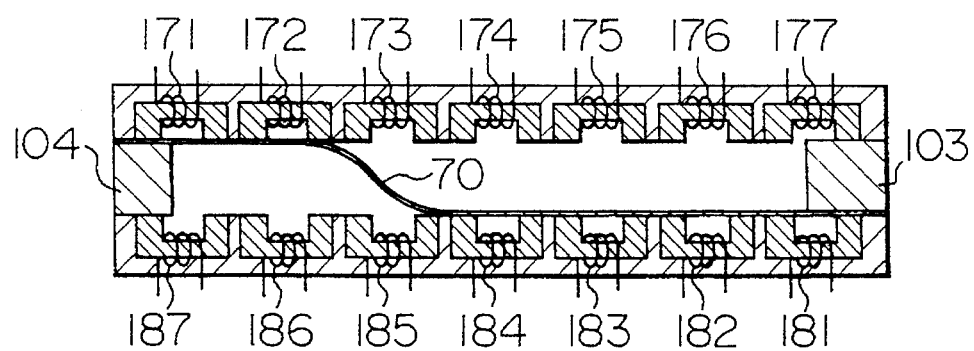
FIG. 21 is a sectional view of an electromagnetic drive type cooling device according to the twelfth embodiment of the present invention.

The twelfth embodiment of the present invention will be described with reference to FIG. 21. FIG. 21 is a sectional view of the electromagnetic drive type cooling device of the present embodiment. Like the constructions shown in the ninth and tenth embodiments, divided magnetic field generating units are used to drive the magnetic film. In the present embodiment, coils are wound around magnetic substances having U shape cross sections to provide electromagnets 171–177 and 181–187 and these electromagnets are disposed on the substrate so that concave sides face each other.

In the flat type magnetic substance shown in the sixth and seventh embodiments, a magnetic circuit formed by the magnetic film and the flat type magnetic substance is open. Thus, lines of magnetic force are emitted to the space. On the other hand, because a magnetic circuit formed by the magnetic film and the U shape magnetic substance is enclosed (closed circuit) by using the U shape magnetic substance, most of lines of magnetic force are enclosed in the magnetic circuit. As a result, a larger magnetic force than that of the construction of the flat type magnetic substance acts on the magnetic film, thereby making it possible to move the film rapidly. FIG. 21 shows a case when the electro-magnets 171, 172 and 181–184 are actuated. In this case, the upper electromagnets 171, 172 and the lower electromagnets 181–184 form closed circuits together with the magnetic film. The left portion of the S shaped section is attracted by the upper electromagnets 171, 172 and the right portion of the S shaped section is attracted by the lower electromagnets 181–184. Meanwhile, the actions of the lower electromagnet and the upper electromagnet opposite to each other is reverse. For example, when the upper electromagnet 171 is turned on, the opposite lower electromagnet 187 is turned off. The magnetic film 70 is moved to the right or the left by controlling electric signals to be supplied to the upper electromagnets 171–177 and the lower electromagnets 181– 187. The magnetic film is moved so as to close a magnetic circuit produced by each electromagnet.

Figure 22:
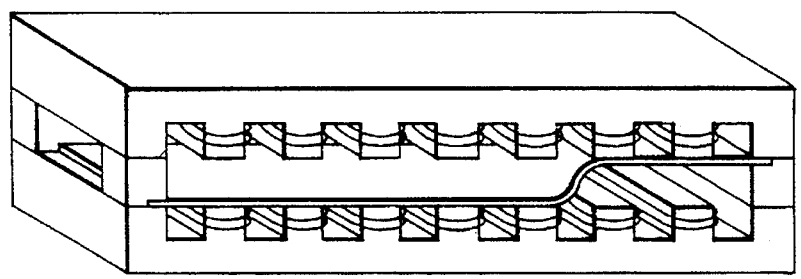
FIG. 22 is a perspective view of an electro-magnetic drive type cooling device according to the thirteenth embodiment of the present invention.
Figure 23A:
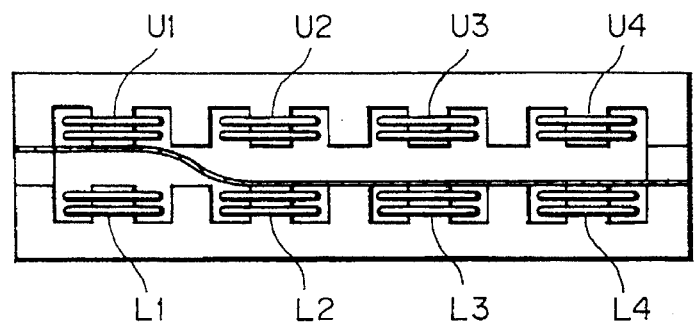
FIGS. 23a and 23b are diagrams showing operation principle of the electromagnetic drive type cooling device according to the thirteenth embodiment of the present invention.
Figure 23B:
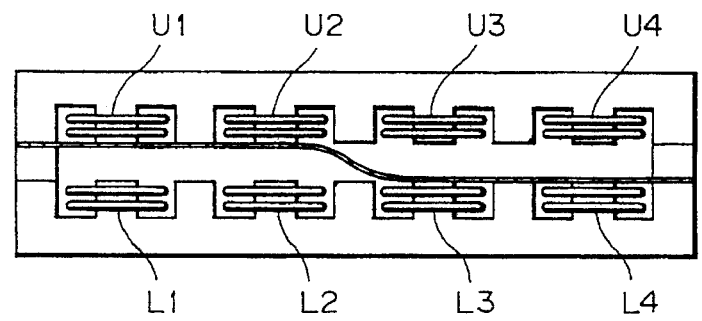
Figure 24:
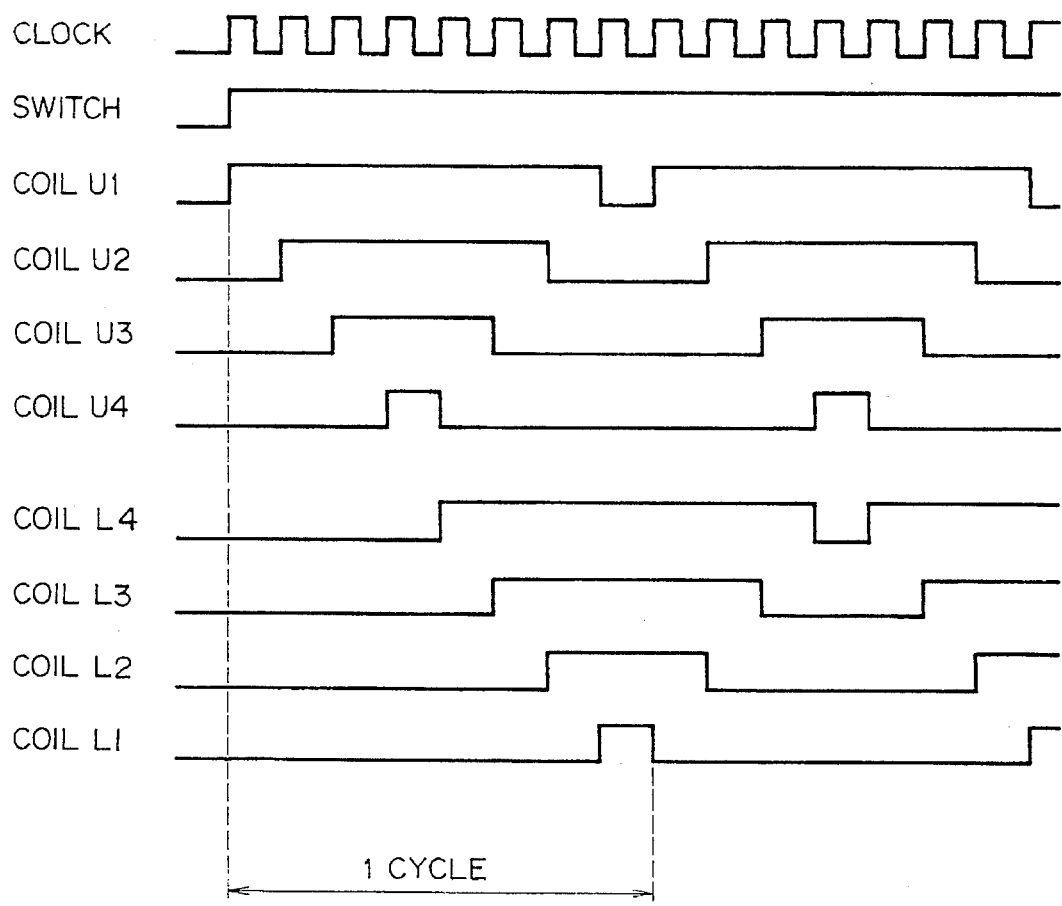
FIG. 24 is a time-chart showing timing for flowing current to respective coils of the electro-magnetic magnetic drive type cooling device according to the thirteenth embodiment.

The thirteenth embodiment of the present invention will be described with reference to FIGS. 22–24. FIG. 22 is a perspective view of an electromagnetic drive type cooling device of the present embodiment. FIGS. 23*a* and 23*b* are views showing the principle of operation. FIG. 24 is a time chart showing the timing for applying current to each coil. As in the cooling device shown in the twelfth embodiment described above, the magnetic film is moved so as to close a magnetic circuit formed by the electromagnets. In the present embodiment, the cross section of the magnetic substance for producing a magnetic field is protruded and a plurality of electrically independent coils are wound around the protruded sections. Whether a coil is formed on each protruded section as shown in FIG. 22 or on every other protruded section as shown in FIG. 23*a* is determined in accordance with the required speed of the magnetic film.

The magnetic film is moved step by step by applying current to the respective upper and lower independent coils successively. FIG. 24 shows a time chart of current to be fed to the upper and lower coils. If currents are fed to the coils U1, U2, U3, U4, L1, L2, L3, L4 in order of the eight upper and lower coils (U1–U4, L1–L4), the magnetic film is moved so as to close a magnetic circuit formed by the respective protruded section of an iron core and the magnetic film. When currents are fed to the upper and lower coils U1–U4, the magnetic film is moved from the left to the right. Thus, if current continues to be fed to the respective coils in order of U1-U2-U3-U4-L4-L3-L2-L1, the magnetic film reciprocates the right and the left. By changing the frequency of the clock signal shown in the time chart, it is possible to change the time period for feeding current to each coil.

FIGS. 23*a* and 23*b* show the condition of the magnetic film when current is fed to the upper and lower coils. As shown in the time chart shown in FIG. 24 and the condition of the magnetic film shown in FIG. 23, currents which are fed to the respective coils are in reverse relationship between the upper and lower coils. That is, when current is flowing to the upper coil, no current is flowing in the lower coil opposite to that coil. Conversely, when current is flowing to the lower coil, no current flows to the upper coil. Thus, when an actuator is driven, current always flows to four coils constituting half of the eight coils. Because the coils are formed on the protruded section in the present embodiment, the thirteenth embodiment can be manufactured easily in comparison with the twelfth embodiment and has an advantage making it possible to produce a thin device.

In the electromagnetic drive type cooling devices shown in FIGS. 14–23, a film supported between two magnetic field generating unit plates is moved up and down by a magnetic force. Thus, it is possible to provide a thin structure cooling device having a thickness of 10 mm by narrowing the gap between the magnetic field generating plates. Additionally, because, in the cooling device of the present invention, the film is driven by a magnetic force, the cooling device can be driven by low voltages below 5 V and integrated with the semiconductor package.

If the cooling device described in the seventh–thirteenth embodiments is mounted on a semiconductor package and employed in the computer shown in FIG. 1, it is possible to effectively dissipate heat from the semiconductor package and the substrate on which the semiconductor package is mounted, as in the cooling devices shown in the first–sixth embodiments.

As is particularly described hereinbefore, according to the present invention, it is possible to form a cooling device having a simple structure comprising a pair of flat plates oppositely disposed with each other with a space therebetween and a film element disposed therebetween. Thus, the cooling device performs cooling with a thin structure in comparison with a rotational fan type cooling device. As a result, it is possible to mount electronic circuit substrates in a high density. Further, the cooling device of the present invention has a remarkable effect to destroy a thermal boundary layer and has a high cooling performance. Further, as the cooling device of the present invention has no sliding portions such as bearings, there is no deterioration of life on account of wear. Further, energy consumption is very small.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. A semiconductor package, comprising:
   a substrate, on which a semiconductor chip including an electronic circuit is mounted, having an I/O portion for inputting and outputting electric signals to and from said semiconductor chip; and
   a heat dissipation part which is disposed on said substrate to expel heat generated from said semiconductor chip, said heat dissipation part being a cooling device,
   said cooling device, comprising:
      a pair of flat plates which face each other with a gap therebetween, either of said flat plates being connected to a heat generating member,
      a pair of side plates which are disposed on both ends of said flat plates and are connected so as to define a space between said pair of flat plates, and
      a flexible film disposed within said space, both ends of said flexible film being fastened near different side plates on opposite ones of said flat plates so that the shape of said flexible film is changeable within said space to expel heat from within said space.

2. A semiconductor package, comprising:
   a substrate, on which a semiconductor chip including an electronic circuit is mounted, having an I/O portion for inputting and outputting electric signals to and from said semiconductor chip; and
   a heat dissipation part which is disposed on said substrate to expel heat generated from said semiconductor chip, said heat dissipation part being a cooling device,
   said cooling device, comprising:
      a pair of flat electrodes, the surfaces of said electrodes being insulated and disposed opposite to each other, either of said electrodes being connected to a heat generating member,
      a pair of side plates being disposed on both ends of said flat electrodes with a gap and are connected so as to define a space between said pair of flat electrodes;
      a flexible film being disposed within said space, said flexible film having conductivity, and
      power feeding means for alternately feeding power to said pair of flat electrodes, both ends of said flexible film being fastened near different side plates on different flat plates so as to be able to change shapes within said space.

3. A computer comprising:
   a substrate on which a plurality of semiconductor packages are mounted;
   a case which incorporates said substrate;
   a keyboard disposed on a surface of said case to input information; and
   a display screen;
   wherein at least one of said semiconductor packages includes a heat dissipation part disposed on a surface opposite to a surface fitted to said substrate and said heat dissipation part being a cooling device,
   said cooling device, comprising:
      a pair of flat plates which face each other with a gap therebetween, either of said flat .plates being connected to a heat generating member,
      a pair of side plates which are disposed on both ends of said flat plates and are connected so as to define a pace between said pair of flat plates, and
      a flexible film disposed within said space, both ends of said flexible film being fastened near different side plates on opposite ones of said flat plates so that the shape of said flexible film is changeable within said space to expel heat from within said space.

4. A computer comprising:
   a substrate on which a plurality of semiconductor packages are mounted;
   a case which incorporates said substrate;
   a keyboard disposed on a surface of said case to input information; and
   a display screen;
   wherein at least one of said semiconductor packages including a heat dissipation part disposed on a surface opposite to a surface fitted to said substrate and said heat dissipation part being a cooling device,
   said cooling device, comprising:
      a pair of flat electrodes, the surfaces of said electrodes being insulated and disposed opposite to each other, either of said electrodes being connected to a heat generating member, a pair of side plates being disposed on both ends of said flat electrodes with a gap and are connected so as to define a space between said pair of flat electrodes, a flexible film being disposed within said space, said flexible film having conductivity, and power feeding means for alternately feeding power to said pair of flat electrodes, both ends of said flexible film being fastened near different side plates on different flat plates so as to be able to change shapes within said space.

5. A computer comprising:

a substrate on which a plurality of semiconductor packages are mounted;

a case which incorporates said substrate;

a keyboard disposed on a surface of said case to input information; and a display screen;

wherein at least one of said semiconductor package includes a cooling device disposed on a surface opposite to a surface fitted to said substrate and has a drive power supply for driving and said cooling device, said cooling device, comprising:

a pair of flat plates which face each other with a gap therebetween, either of said flat plates being connected to a heat generating member, a pair of side plates which are disposed on both ends of said flat plates and are connected so as to define a space between said pair of flat plates, wherein said flat plates are electrodes, and a flexible film disposed within said space, both ends of said flexible film being fastened near different side plates on opposite ones of said flat plates so that the shape of said flexible film is changeable within said space to expel heat from within said space.

6. A cooling device comprising:

a magnetic film, both ends of which are mounted within said device;

two magnetic field generating units which generate magnetic fields according to electric signals, either of said magnetic field generating units being connected to a heat generating member; and side plates mounted between said two magnetic field generating units;

wherein one end of said magnetic film is in contact with one of said magnetic field generating units and the other end of said magnetic field is in contact with the other magnetic field generating unit so that a part of the portion of said magnetic film which is not fastened by said side plates is elastically deformed.

7. A cooling device according to claim 6 wherein both of said magnetic field generating units comprise a plurality of divided independent magnetic field generating units.

8. A cooling device according to claim 7 wherein the shape of said magnetic film is changed by controlling said plurality of said independent magnetic field generating units.

9. A semiconductor package comprising:

a substrate on which a semiconductor chip containing an electronic circuit is mounted, said substrate having an I/O portion for inputting and outputting electric signals to and from said semiconductor chip; and a heat dissipation part disposed on said substrate to expel heat generated from said semiconductor chip, said heat dissipation part being a cooling device according to claim 6.

10. A computer comprising:

a substrate on which a plurality of semiconductor packages are mounted;

a case which incorporates said substrate;

a keyboard disposed on a surface of said case to input information; and a display screen;

wherein at least one of said semiconductor packages includes a heat dissipation part disposed on a surface opposite to a surface fitted to said substrate, said heat dissipation part being a cooling device according to claim 6.

\* \* \* \* \*